United States Patent [19]

Huber et al.

[11] 4,025,142

[45] May 24, 1977

[54] COVER FOR USE WITH A RIBBON COAXIAL CABLE CONNECTOR

[75] Inventors: John Henry Huber; Suel Grant Shannon, both of Harrisburg, Pa.

[73] Assignee: AMP Incorporated, Harrisburg, Pa.

[22] Filed: Sept. 1, 1976

[21] Appl. No.: 719,547

Related U.S. Application Data

[63] Continuation of Ser. No. 641,413, Dec. 17, 1975, abandoned.

[52] U.S. Cl. .............................. 339/128; 339/17 C; 339/176 MF

[51] Int. Cl.[2] .......................................... H05K 1/12

[58] Field of Search ........... 317/101 DH; 339/17 C, 339/17 CF, 17 F, 125 R, 128, 176 MF

[56] References Cited

UNITED STATES PATENTS

| | | | |
|---|---|---|---|
| 3,702,982 | 11/1972 | Kelly et al. | 339/176 MF X |
| 3,725,842 | 4/1973 | Fieldberg | 339/17 CF |
| 3,744,009 | 7/1973 | Teagno et al. | 339/17 C X |
| 3,963,319 | 6/1976 | Schumacher et al. | 339/17 F X |

*Primary Examiner*—Roy Lake
*Assistant Examiner*—E. F. Desmond
*Attorney, Agent, or Firm*—Allan B. Osborne

[57] ABSTRACT

This invention relates to a device which removably latches a ribbon coaxial cable connector to a printed circuit board. More particularly the device has a pair of depending legs each having a pair of oppositely projecting latches. One set of latches adapted to removably retain the connector to the printed circuit board and the second set of latches adapted to provide a removable cover for the connector.

3 Claims, 3 Drawing Figures

COVER FOR USE WITH A RIBBON COAXIAL CABLE CONNECTOR

CROSS REFERENCE TO RELATED APPLICATION

This is a continuation of application Ser. No. 641,413, filed Dec. 17, 1975, now abandoned.

BACKGROUND OF THE INVENTION

1. Field of the Invention

The invention is in the field of devices serving the dual function of providing a removable cover for a ribbon coaxial cable connector and of providing a latching means for removably attaching the connector to a printed circuit board or the like.

2. Description of the Prior Art

Prior art devices consist of a housing having cable conductor terminals within and integral locking means which protrude through openings in a board or panel. One such device is disclosed in U.S. Pat. No. 3,530,426.

SUMMARY OF THE INVENTION

The invention comprises a cover member having a depending leg on each side. Each leg carries a pair of latches, a first one projecting inwardly and the other projecting outwardly and spaced downwardly on the leg from the first. The dual sets of latches provide independent means for removably retaining a ribbon cable connector on a printed circuit board or the like and for removably retaining the cover on the connector.

DESCRIPTION OF THE PREFERRED EMBODIMENT

Figure 1:
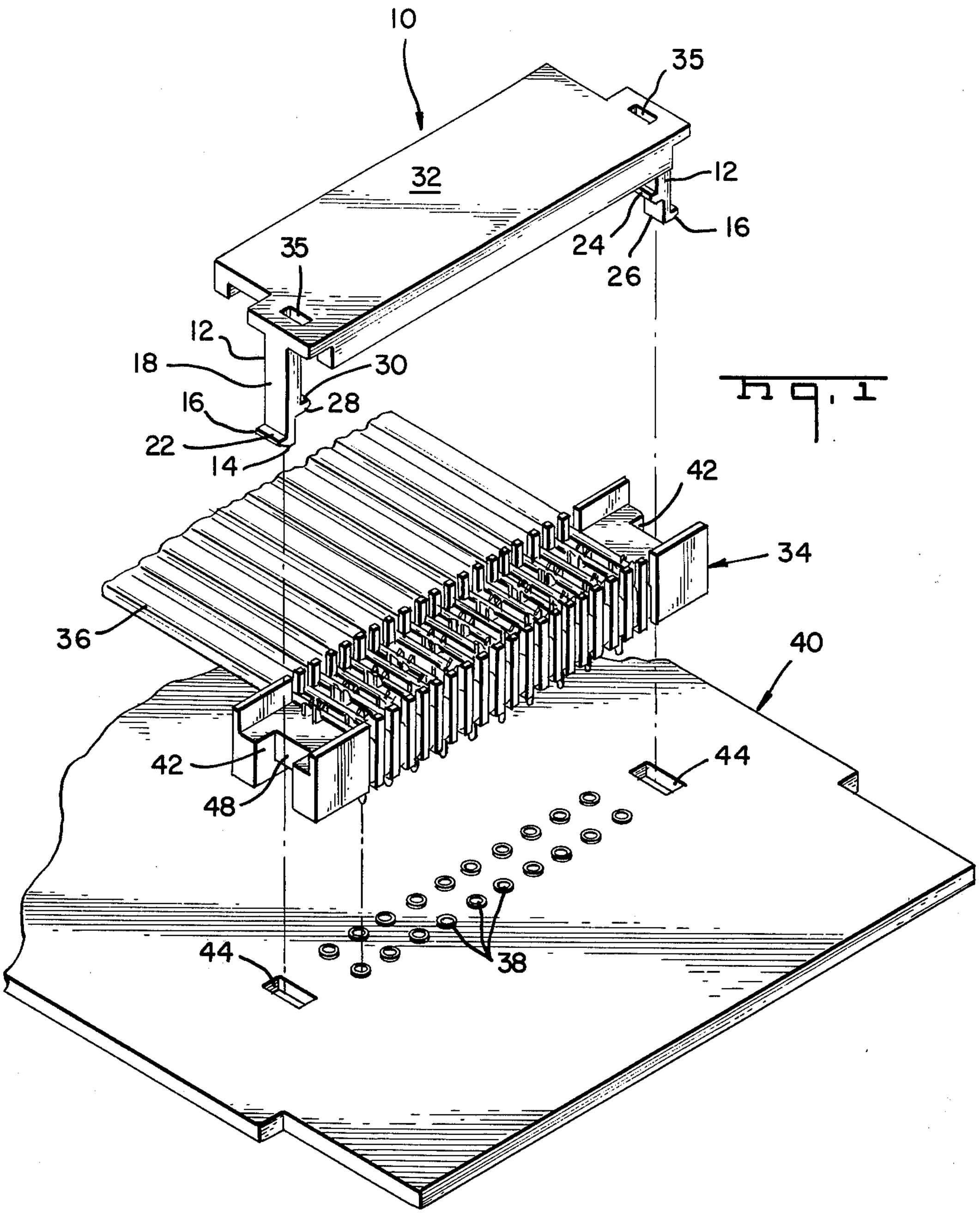
FIG. 1 is a perspective view of the preferred embodiment of the present invention along with the ribbon coaxial cable connector and a printed circuit board.
Figure 2:
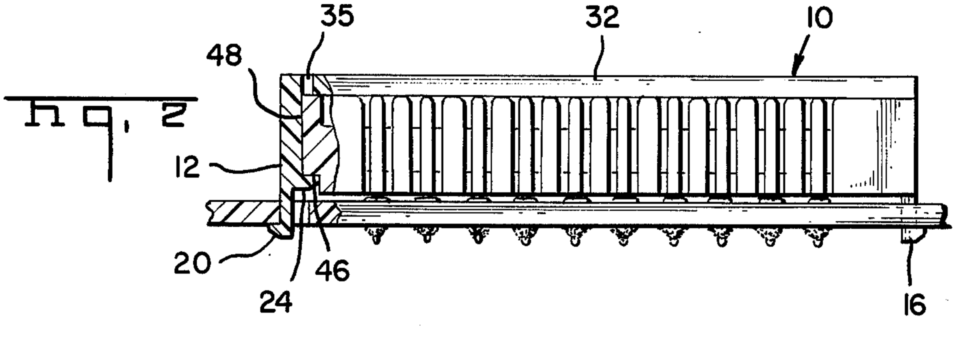
FIG. 2 is an elevational, partly sectioned view of the preferred embodiment of FIG. 1 as assembled on the connector and board.

The cover of the present invention is designated by reference numeral 10 in FIGS. 1 and 2. In general it represents a cover which may be adapted for use with any connector. On each side thereof a resilient leg 12 extends from the cover and preferably is an integral part thereof. At free end 14 on each leg a lower latch 16 extends outwardly from the outer surface 18 of the leg. The lower surface of the latch has a beveled portion as indicated by reference numeral 20. The upper surface of the latch is generally flat and provides an upwardly facing shoulder 22.

An upper latch 24 is positioned on the inside surface 26 of each leg and projects inwardly towards the opposite leg. As with the lower latch, the lower surface of upper latch 24 has a beveled surface 28 and on the upper surface an upwardly facing shoulder 30.

The lid 32 of cover 10 spans the distance between the legs 12 and provides protection for the top of connector 34 shown immediately below the cover. The pair of holes 35 positioned in the lid, each immediately inward from the leg 12, are mold pin holes. The cover extends rearwardly and has a depending bar 50 at its free end 52 (FIG. 3.

Figure 3:
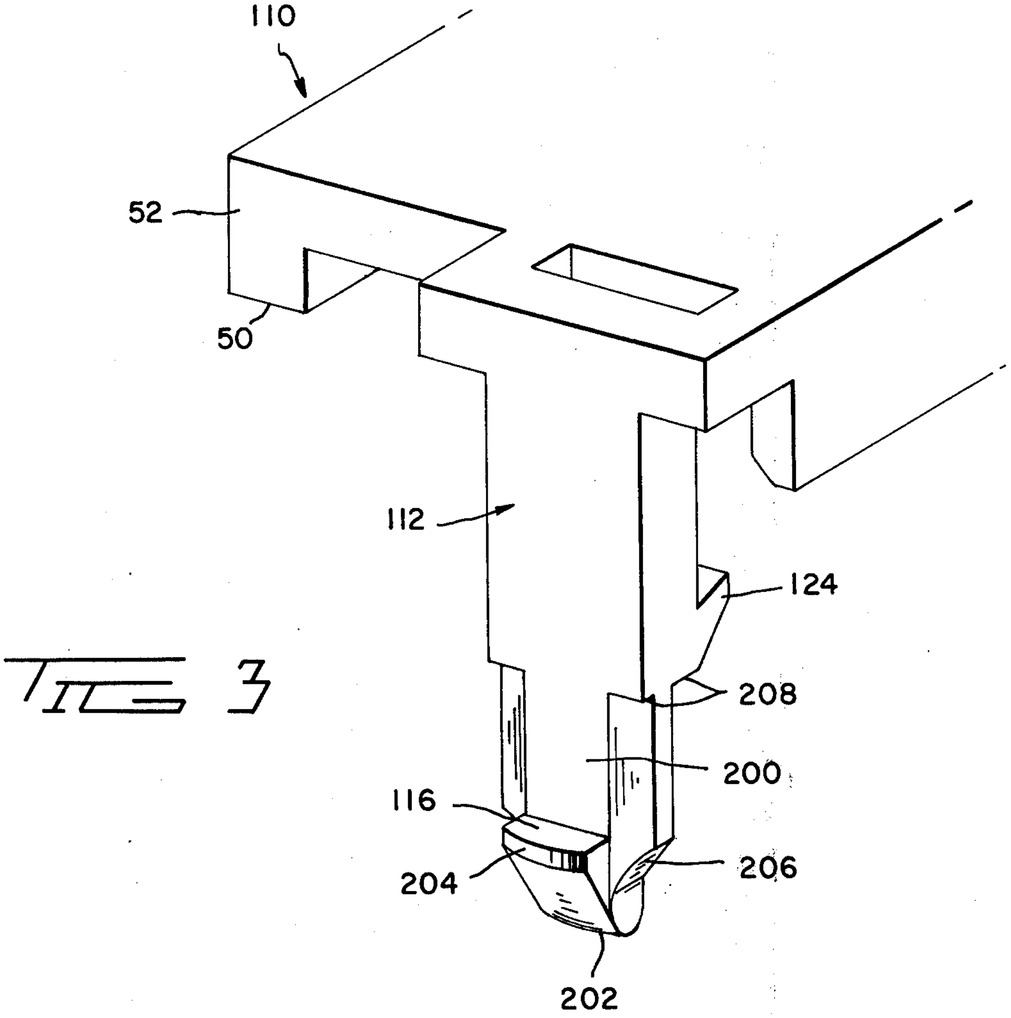
FIG. 3 is a perspective view of one end of the cover of the preferred invention showing a second embodiment of one leg.

Referring now to FIG. 3, a modified cover 110 is shown. Resilient legs 112, depending from the cover, has two latches, lower latch 116 and upper latch 124. While the latter is not unlike latch 24 (FIG. 1), lower latch 116 and the lower portion 200 of leg 112 has been modified. From the very tip 202 of the leg upwardly the bevel or contour has been made more gradual. The latch itself is rounded as indicated by reference numeral 204. Additionally the width of the leg at the tip 202 has been reduced with a gradual transition to its full width as indicated by reference numeral 206. Also, the thickness of the lower portion 200 is less as indicated by downwardly facing shoulders 208.

The above noted modifications provide a lead-in radius so that legs 112 can be inserted into round holes (not shown) on a board. This modification permits board manufacturers to drill rather than punch the leg receiving holes thereby reducing manufacturing costs. Further the curved latch surfaces reduce wear experienced by sharp corners being inserted into round corners.

As noted above, the cover can be easily designed to fit any connector; in the drawing the connector shown is one which terminates the ribbon coaxial cable 36 and in turn connects the several conductors to the several circuits 38 on paddle-card board 40. Of course, before the cover 10 can be used, both connector 34 and board 40 must be provided with receiving means for legs 12 and also lid 32 must be adapted to fit the superstructure of the connector. With regard to the former requirements, connector 34 contains a slot 42 on each side thereof and the board contains a pair of leg-receiving openings 44. The slots end upwardly from the base of connector 34 to provide a downwardly facing shoulder 46.

Cover 10 is placed onto connector 34 by aligning legs 12 with slots 42 and pressing downwardly. Legs 12 are cammed outwardly by the beveled surface 28 until latches 24 clear the inside wall 48 defining the slots. The legs snap back with upper surfaces 30 on latches 24 sliding onto shoulders 46 thereby securing the cover to the connector.

The assembled unit, cover 10 and connector 34, can now be plugged into board 40. As legs 12 are inserted into openings 44, the beveled surfaces 20 cam them inwardly. As latches 16 pass through the openings, the legs spring outwardly into a locking relation with board 40 as shown in FIG. 2.

The legs are able to be cammed inwardly because of their resiliency. By the same token, the assembly is easily removable from the board by simply squeezing in on the legs and pulling upwardly. The rearward extension and depending bar 50 provide a strain relief for the underlying cable to prevent accidental pull-out.

The embodiments shown in the drawings are adapted to be modified to fit any need and connector, for example, a shield for the front of the connector 34 can be provided by including a depending wall (not shown) on the front edge of cover 10. Yet another modification is to provide a space between the inside surface 26 of the legs and the inside walls 48 of the slots. This can be done by elongating latches 24 and the distance between the legs. The space then gives room for the legs to be moved inwardly as such are being passed through the opening 44. These and other modifications will no doubt occur from time to time by the users thereof.

Cover 10 is preferably molded from a resilient plastic material such as nylon or Lexan, the later being the trademark of General Electric Company.

The foregoing detailed description has been given for clearness of understanding only, and no necessary limitations should be understood therefrom, as some modifications will be obvious to those skilled in the art.

What is claimed is:

1. A cover for use with an electrical connector of the type having side slots and downwardly facing shoulders in association therewith and useful for removably locking the connector to a printed circuit board or the like having a pair of spaced openings therethrough, said cover comprising:

a. a lid adapted to be positioned on the connector;

b. a rearward extension on the lid having a depending bar extending across the width thereof, said bar adapted to provide strain relief for a cable which may be attached to the connector; and c. a pair of resilient legs each depending from opposite sides of the lid and each being a single unit and having a lower and an upper latch thereon, said lower latch being positioned on the outside surface of the leg and projecting outwardly, said upper latch being spaced above the first latch on the inside surface of the leg and projecting inwardly, said upper latches adapted to engage the shoulders and removably lock the lid to the connector and the lower latches adapted to be inserted through the openings and removably lock the connector to the printed circuit board or the like.

2. A cover for use with an electrical connector of the type having side slots and downwardly facing shoulders in association therewith and useful for removably locking the connector to a printed circuit board or the like having a pair spaced openings therethrough, said cover comprising:

a. a lid adapted to be positioned on the connector; and b. a pair of resilient legs each depending from opposite sides of the lid and each having spaced apart, shoulder-defining lower and upper latches thereon, said lower latch projecting outward from the outside surface of the leg at a point removed from the free end thereof, with the surface from the free end to the latch shoulder being beveled vertically and rounded transversely, said upper latch projecting inwardly from the inside surface of the leg, said upper latches adapted to engage the shoulders and removably lock the lid to the connector and the lower latches adapted to be inserted through to removably lock the connector to a printed circuit board or the like.

3. The cover of claim 2 wherein the lower portions of the legs are of reduced width and thickness relative to the upper portions.

* * * * *